United States Patent
Wang

(10) Patent No.: US 11,626,579 B2
(45) Date of Patent: Apr. 11, 2023

(54) OLED DISPLAY PANEL WITH LIGHT SHIELDING LAYER DISPOSED ON TOUCH STRUCTURE

(71) Applicant: Wuhan China Star Optoelectronics Semiconductor Display Technology Co., Ltd., Hubei (CN)

(72) Inventor: Lei Wang, Hubei (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 291 days.

(21) Appl. No.: 16/980,878

(22) PCT Filed: Jun. 19, 2020

(86) PCT No.: PCT/CN2020/096950
§ 371 (c)(1),
(2) Date: Sep. 15, 2020

(87) PCT Pub. No.: WO2021/248542
PCT Pub. Date: Dec. 16, 2021

(65) Prior Publication Data
US 2021/0384475 A1    Dec. 9, 2021

(30) Foreign Application Priority Data
Jun. 9, 2020 (CN) .................. 202010516655.X

(51) Int. Cl.
*H01L 51/52* (2006.01)
*H01L 27/32* (2006.01)
*G06F 3/041* (2006.01)
*G06F 3/044* (2006.01)

(52) U.S. Cl.
CPC ........ *H01L 51/5284* (2013.01); *G06F 3/0412* (2013.01); *G06F 3/0443* (2019.05); *H01L 27/322* (2013.01); *H01L 27/323* (2013.01); *H01L 27/3246* (2013.01); *H01L 27/3258* (2013.01); *H01L 51/5253* (2013.01); *G06F 2203/04111* (2013.01)

(58) Field of Classification Search
None
See application file for complete search history.

(56) References Cited

U.S. PATENT DOCUMENTS

| | | | |
|---|---|---|---|
| 2019/0012022 A1* | 1/2019 | Ye | G06F 3/04164 |
| 2019/0067394 A1* | 2/2019 | Cheon | H01L 27/3283 |
| 2021/0335238 A1* | 10/2021 | Song | H01L 27/3246 |
| 2021/0358996 A1* | 11/2021 | Lee | H01Q 19/005 |

FOREIGN PATENT DOCUMENTS

| | | |
|---|---|---|
| CN | 105742330 | 7/2016 |
| CN | 107104131 | 8/2017 |
| CN | 107589576 | 1/2018 |
| CN | 109300941 | 2/2019 |

(Continued)

*Primary Examiner* — Nduka E Ojeh

(57) ABSTRACT

The present application provides an organic light-emitting diode (OLED) display panel. The OLED display panel includes an array substrate and a touch structure. The array substrate includes a light shielding layer. The touch structure is integrated with the array substrate. The light shielding layer is arranged on the touch structure.

18 Claims, 2 Drawing Sheets

(56) References Cited

FOREIGN PATENT DOCUMENTS

| | | |
|---|---|---|
| CN | 109638042 | 4/2019 |
| CN | 109841661 | 6/2019 |
| CN | 110096177 | 8/2019 |
| CN | 110174973 | 8/2019 |
| CN | 110176479 | 8/2019 |
| CN | 110262682 | 9/2019 |
| CN | 111129082 | 5/2020 |
| KR | 10-2014-0062341 | 5/2014 |

* cited by examiner

# OLED DISPLAY PANEL WITH LIGHT SHIELDING LAYER DISPOSED ON TOUCH STRUCTURE

RELATED APPLICATIONS

This application is a National Phase of PCT Patent Application No. PCT/CN2020/096950 having International filing date of Jun. 19, 2020, which claims the benefit of priority of Chinese Patent Application No. 202010516655.X filed on Jun. 9, 2020. The contents of the above applications are all incorporated by reference as if fully set forth herein in their entirety.

FIELD AND BACKGROUND OF THE INVENTION

The present application relates to a field of display technology and in particular, to an organic light-emitting diode (OLED) display panel.

With continuous development of organic light-emitting diode (OLED) display technology, touch screens are more and more commonly used in display devices such as smart phones and tablet computers.

Conventional touch technology of OLED displays is mainly embedded touch technology, that is, touch functions are realized by a touch structure integrated into a display panel.

Embedded touch screens usually use a capacitive touch structure. Since touch electrode layers in touch structures are mostly made of metal, the light incident on the metal film layer is reflected in the presence of OLED light-emitting elements and ambient light, which directly affects display effects of a display panel.

SUMMARY OF THE INVENTION

The present application provides an organic light-emitting diode (OLED) display panel to solve a problem that light is reflected from metal film layers in a touch structure.

The present application provides an organic light-emitting diode (OLED) display panel, comprising:

an array substrate, the array substrate comprising a light shielding layer and a first conductive layer, the first conductive layer comprising an anode, a source, a drain, and a plurality of bridges, wherein the anode, the source, and the drain are all arranged in a same layer as the bridges, and the anode is electrically insulated from the bridges; and a touch structure integrated with the array substrate;

wherein the light shielding layer is disposed on the touch structure.

In the OLED display panel of the present application, the array substrate comprises a first planarization layer, a second conductive layer, and a pixel definition layer sequentially disposed on the first conductive layer;

the second conductive layer comprises a plurality of first electrodes and a plurality of second electrodes arranged in a same layer, the adjacent first electrodes are electrically connected by the bridge, and the first electrodes, the second electrodes, and the bridges constitute the touch structure; and the light shielding layer is the pixel definition layer.

In the OLED display panel of the present application, the OLED display panel further comprises:

a light-emitting functional layer disposed on the array substrate, the light-emitting functional layer comprising a plurality of light-emitting pixels;

an encapsulation layer disposed on the light-emitting functional layer; and a color filter structure layer integrated with the encapsulation layer, wherein the color filter structure layer comprises a plurality of color resists, and the color resists are disposed on the light-emitting pixels in one-to-one correspondence.

In the OLED display panel of the present application, the encapsulation layer comprises a first inorganic layer, an organic layer, and a second inorganic layer disposed in sequence, and the color filter structure layer is disposed between the first inorganic layer and the organic layer.

In the OLED display panel of the present application, the array substrate further comprises a substrate, a buffer layer, an active layer, a first insulating layer, a first gate metal layer, a second insulating layer, a second gate metal layer, a dielectric insulating layer, a source/drain metal layer, and a second planarization layer arranged in sequence, and the first planarization layer, the second planarization layer, and the dielectric insulating layer are all made of a black material.

In the OLED display panel of the present application, a plurality of first openings are defined in the first planarization layer, the first openings expose the anode, and the light-emitting pixels are disposed in the first openings; a plurality of second openings are defined in the pixel definition layer, and the second openings are arranged corresponding to and in communication with the first openings, respectively; and the light-emitting functional layer further comprises a cathode layer disposed on the pixel definition layer and covers the second opening.

In the OLED display panel of the present application, the second conductive layer further comprises an anode disposed in a same layer as the first electrodes and the second electrodes, and the anode is electrically insulated from the first electrodes and the second electrodes.

In the OLED display panel of the present application, the bridges and the drain are integrally formed.

The present application further provides an organic light-emitting diode (OLED) display panel, comprising:

an array substrate comprising a light shielding layer; and a touch structure integrated with the array substrate;

wherein the light shielding layer is disposed on the touch structure.

In the OLED display panel of the present application, the array substrate comprises a first conductive layer, a first planarization layer, a second conductive layer, and a pixel definition layer arranged in sequence;

the first conductive layer comprises a plurality of bridges;

the second conductive layer comprises a plurality of first electrodes and a plurality of second electrodes arranged in a same layer, the adjacent first electrodes are electrically connected by the bridge, and the first electrodes, the second electrodes, and the bridges constitute the touch structure; and the light shielding layer is the pixel definition layer.

In the OLED display panel of the present application, the OLED display panel further comprises:

a light-emitting functional layer disposed on the array substrate, the light-emitting functional layer comprising a plurality of light-emitting pixels;

an encapsulation layer disposed on the light-emitting functional layer; and a color filter structure layer integrated with the encapsulation layer, the color filter structure layer comprising a plurality of color resists, the color resists disposed on the light-emitting pixels in one-to-one correspondence.

In the OLED display panel of the present application, the encapsulation layer comprises a first inorganic layer, an organic layer, and a second inorganic layer disposed in sequence, and the color filter structure layer is disposed between the first inorganic layer and the organic layer.

In the OLED display panel of the present application, the first conductive layer further comprises an anode disposed in a same layer as the bridges and electrically insulated from the bridges.

In the OLED display panel of the present application, the array substrate further comprises a substrate, a buffer layer, an active layer, a first insulating layer, a first gate metal layer, a second insulating layer, a second gate metal layer, a dielectric insulating layer, a source/drain metal layer, and a second planarization layer arranged in sequence, and the first planarization layer, the second planarization layer, and the dielectric insulating layer are all made of a black material.

In the OLED display panel of the present application, a plurality of first openings are defined in the first planarization layer, the first openings expose the anode, and the light-emitting pixels are disposed in the first openings; a plurality of second openings are defined in the pixel definition layer, and the second openings are arranged corresponding to and in communication with the first openings, respectively;

the light-emitting functional layer further comprises a cathode layer disposed on the pixel definition layer and covers the second openings.

The OLED display panel of the present application, the first conductive layer further comprises a source and a drain, and the source and the drain are both disposed in a same layer as the bridges; and the second conductive layer further comprises an anode disposed in a same layer as the first electrodes and the second electrodes, the anode electrically insulated from the first electrodes and the second electrodes.

In the OLED display panel of the present application, the bridges and the drain are integrally formed.

In the OLED display panel of the present application, the array substrate further comprises a base substrate, a buffer layer, an active layer, a first insulating layer, a first gate metal layer, a second insulating layer, a second gate metal layer, and a dielectric insulating layer disposed in sequence, and the first planarization layer and the dielectric insulating layer are both made of a black material.

In the OLED display panel of the present application, a plurality of first openings are defined in the pixel definition layer, the first openings expose the anode, and the light-emitting pixels are disposed on the anode; and the light-emitting functional layer further comprises a cathode layer disposed on the pixel definition layer and covers the first openings.

In the OLED display panel of the present application, the bridges and the drain are integrally formed.

Compared with conventional OLED display panels, the OLED display panel of the present application is provided with the light shielding layer on the touch structure, thereby effectively shielding the light incident on the touch structure, avoiding light being reflected off the metal film layer, and improving the display effects of the display panel.

BRIEF DESCRIPTION OF THE SEVERAL VIEWS OF THE DRAWINGS

In order to more clearly illustrate the embodiments of the present disclosure or related art, figures which will be described in the embodiments are briefly introduced hereinafter. It is obvious that the drawings are merely for the purposes of illustrating some embodiments of the present disclosure, and a person having ordinary skill in this field can obtain other figures according to these figures without inventive work.

DETAILED DESCRIPTION OF SPECIFIC EMBODIMENTS OF THE INVENTION

Figure 1:
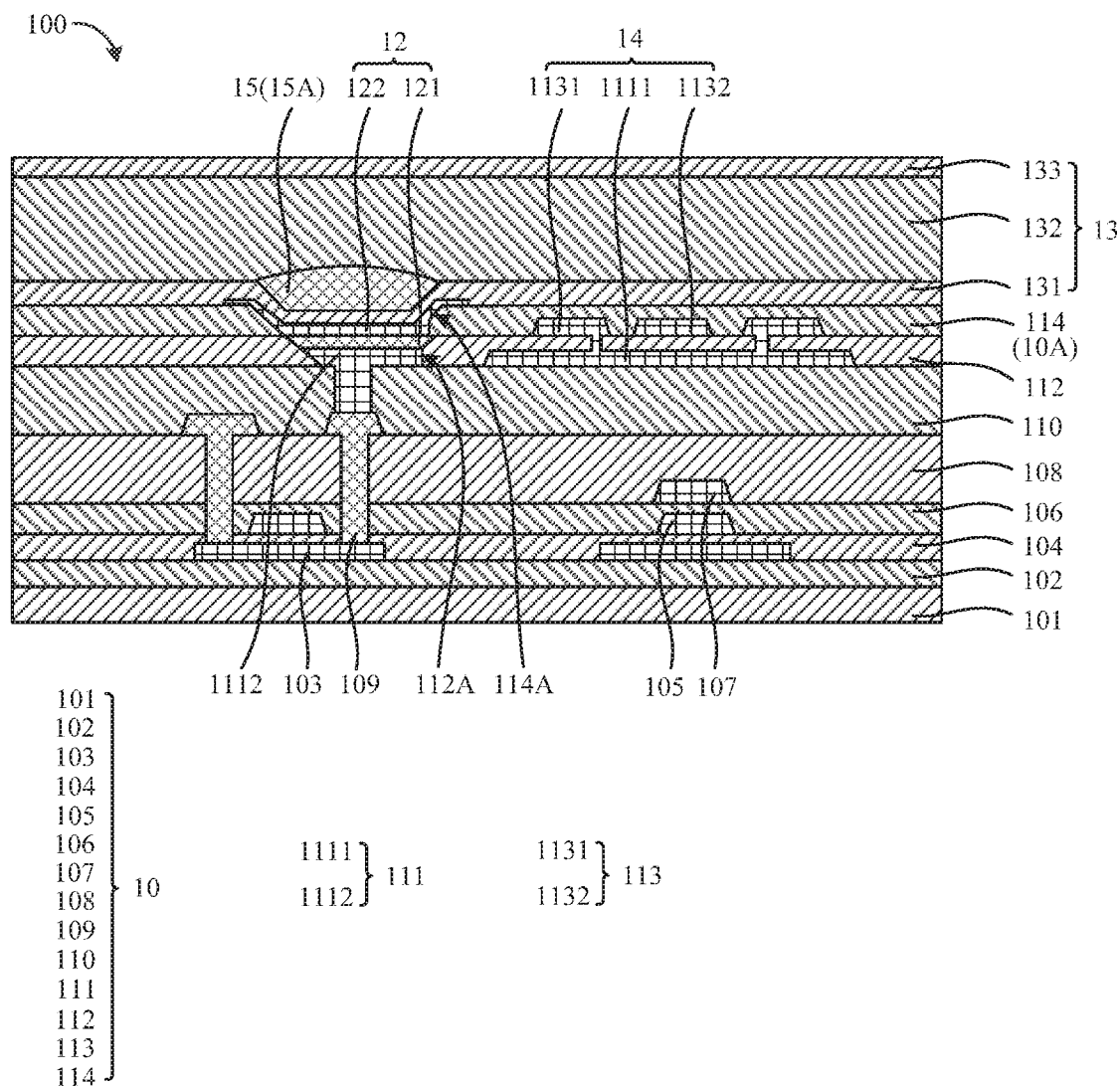
FIG. 1 is a schematic structural view illustrating an organic light-emitting diode (OLED) display panel according to a first embodiment of the present application.

Technical solutions of the present application will be clearly and completely described below with reference to the accompanying drawings and in conjunction with specific embodiments. Obviously, the described embodiments are only some of the embodiments of the present application, but not all the embodiments. Based on the embodiments of the present application, all other embodiments obtained by those skilled in the art without creative work fall into the protection scope of the present application.

In the description of the present application, it should be understood that the directional terms, such as "center", "longitudinal", "transverse", "length", "width", "thickness", "upper", "lower", "front", "rear", "left", "right", "vertical", "horizontal", "top", "bottom", "inner", "outer", "clockwise", "counterclockwise", are based on the orientation or positional relationship shown in the drawings, and are only for the convenience of describing the present application and simplifying the description. The directional terms do not indicate or imply that the device or element referred to must have a specific orientation or be constructed or operated in a specific orientation. Therefore, the directional terms cannot be understood as a limitation to the present application. In addition, the terms "first" and "second" are used for illustrative purposes only, and cannot be understood as indicating or implying relative importance or implicitly indicating the number of technical features indicated. Therefore, the features defined as "first" and "second" may explicitly or implicitly include one or more of the features. In the description of the present application, "multiple" means two or more, unless specifically defined otherwise.

In the description of the present application, it should be noted that the term "connected" should be understood in a broad sense unless otherwise specified and defined. For example, it can be a fixed connection, a detachable connection, or an integral connection; it can be a mechanical connection, an electrical connection, or two elements can communicate with each other. Two elements can be directly connected to each other or can be indirectly connected through an intermediate medium, or they are connected internally or interact with each other. For those of ordinary skill in the art, the specific meanings of the above term in the present application can be understood on a case-by-case basis.

In the present application, unless explicitly stated and defined otherwise, a first element being "on" or "under" a second element may indicate that, the first element is in direct contact with the second element, or can mean that, the first element is not in direct contact with the second element, and instead they make contact through another element between them. Moreover, the first element being "above", ""over"", and "on" the second element can indicate that the first element is right above and obliquely above the second element, or merely indicates that the first element is higher in level than the second element. The first element being "below", "under", or "beneath" the second element can mean that, the first element is right below or obliquely below the second element, or merely indicates that the first element is lower in level than the second element.

The following disclosure provides various embodiments or examples for realizing different structures of the present application. In order to simplify the disclosure of the present application, the components and configurations of specific examples are described below. Certainly, they are only examples, and the purpose is not to limit the present application. In addition, the present application may repeat reference numerals and/or reference letters in different examples. Such repetition is for simplicity and clarity, and does not indicate the relationship between the various embodiments and/or configurations discussed. In addition, the present application provides examples of various specific processes and materials, but those of ordinary skill in the art may be aware of the application of other processes and/or the use of other materials.

Referring to FIG. 1, FIG. 1 is a schematic structural view illustrating an organic light-emitting diode (OLED) display panel according to a first embodiment of the present application.

The OLED display panel 100 according to the first embodiment of the present application comprises an array substrate 10, a light-emitting functional layer 12, and an encapsulation layer 13 that are sequentially arranged. The array substrate 10 comprises a light shielding layer 10A. The OLED display panel 100 further comprises a touch structure 14 and a color filter structure layer 15. The touch structure 14 is integrated in the array substrate 10. The color filter structure layer 15 is integrated on the encapsulation layer 13. The light shielding layer 10A is disposed on the touch structure 14.

The OLED display panel 100 provided by the first embodiment of the present application effectively shields the light incident on the touch structure 14 by providing the light shielding layer 10A on the touch structure 14, thus avoiding light being reflected off a metal film layer in the touch structure 14, thereby further improving display effects of the display panel.

In addition, the first embodiment of the present application can also reduce a thickness of the display panel by integrating the touch structure 14 into the array substrate 10, thereby improving flexibility of the OLED display panel, which is beneficial to the development of dynamically bendable OLED products.

In the first embodiment of the present application, the array substrate 10 comprises a substrate 101, a buffer layer 102, an active layer 103, a first insulating layer 104, a first gate metal layer 105, a second insulating layer 106, a second gate metal layer 107, a dielectric insulating layer 108, a source/drain metal layer 109, and a second planarization layer 110 which are sequentially arranged, and comprises a first conductive layer 111, a first planarization layer 112, a second conductive layer 113, and a pixel definition layer 114.

Specifically, the first conductive layer 111 includes a plurality of bridges 1111. The second conductive layer 113 includes a plurality of first electrodes 1131 and second electrodes 1132 arranged in the same layer. The adjacent first electrodes 1131 are electrically connected by the bridge 1111. The first electrodes 1131, the second electrodes 1132, and the bridges 1111 constitute the touch control structure 14. The light shielding layer 10A is the pixel definition layer 114.

It should be noted that the light shielding layer 10A can also be disposed in other film layers of the array substrate 10, and a specific position of the light shielding layer 10A can be decided according to a position of the touch structure 14; the present application is not limited in this regard.

Selectively, the first electrode 1131 is a driving electrode, and the second electrode 1132 is a sensing electrode, or alternatively, the first electrode 1131 is a sensing electrode, and the second electrode 1132 is a driving electrode.

In the first embodiment of the present application, the first electrode 1131 is a driving electrode, and the second electrode 1132 is a sensing electrode. The first electrode 1131 and the second electrode 1132 are electrically insulated from each other.

It should be noted that the touch structure 14 in the first embodiment of the present application can be a mutual-capacitance type or a self-capacitance type, and the present application is not limited in this regard.

It should be noted that the bridge 1111 is only used to connect the adjacent first electrodes 1131. The bridge 1111 can be disposed above or below the first electrode 1131. The first embodiment of the present application takes for example that the bridge 1111 is disposed below the first electrode 1131; however, the present application is not limited in this regard.

In the first embodiment of the present application, the first electrode 1131, the second electrode 1132, and the bridge 1111 are made of one or a combination of metals such as silver, gold, copper, or aluminum. In some embodiments, the first electrode 1131, the second electrode 1132, and the bridge 1111 can also be made of metal oxides such as indium tin oxide, indium zinc oxide, antimony tin oxide, or antimony zinc oxide, or other transparent conductive material; a detailed description thereof is omitted herein for brevity.

In addition, the first electrode 1131, the second electrode 1132, and the bridge 1111 can be made of the same material or different materials; the present application is not limited in this regard.

Selectively, a material of the light shielding layer 10A is black ink, organic photoresist, or other black materials with light shielding effects.

It can be understood that when the pixel definition layer 114 is used as the light shielding layer 10A, the light incident on the touch structure 14 can be effectively shielded, thereby avoiding light being reflected off the first electrode 1131, the second electrode 1132, and the bridge 1111, which would be radiated to a display region of the panel to affect the display effects. Accordingly, the display quality of the display panel is improved.

In the first embodiment of the present application, the first conductive layer 111 further comprises an anode 1112. The anode 1112 is in the same layer as the bridge 1111 and is electrically insulated from the bridge 1111. By arranging the bridge 1111 and the anode 1112 in the same layer, a thickness of the array substrate 10 is reduced, thereby further reducing a thickness of the display panel.

Further, the light-emitting functional layer 12 comprises a plurality of light-emitting pixels 121. The color filter structure layer 15 comprises a plurality of color resists 15A. The color resists 15A are disposed on the light-emitting pixels 121 in one-to-one correspondence.

In conventional OLED display panels, the color filter structure layer 15 is usually disposed above the encapsulation layer 13. The color filter structure layer 15 comprises the color resists 15A and a black matrix between the color resists 15A. Because a refractive index of each film layer in the encapsulation layer 13 is different, when the light emitted by the light-emitting pixels 121 is emitted through the encapsulation layer 13 with a different refractive index, there is usually significant dispersion, which directly affects light extraction (light emission) of the light-emitting pixels 121. In the first embodiment of the present application, by integrating the color filter structure layer 15 with the encapsulation layer 13, a distance between the color resist 15A and the light-emitting pixel 121 is reduced, and a light path of the light-emitting pixel 121 is shortened, thereby reducing a probability of dispersion and improving the light extraction efficiency of the light-emitting pixels 121.

In addition, by reducing the distance between the light-emitting pixel 121 and the color filter structure layer 15, the present application reduces a probability that the light emitted from the light-emitting pixels 121 is absorbed by the black matrix in the color filter structure layer 15, thereby improving a light utilization rate and also improving light extraction efficiency of the light-emitting pixels 121.

Furthermore, under a premise that the light extraction efficiency of the light-emitting pixels 121 is maintained, a size of an opening of the film layer where the color resists 15A are located can be reduced, thereby meeting the design requirements for a high pixel density display panel, and further improving the display effects of the display panel.

Specifically, the encapsulation layer 13 comprises a first inorganic layer 131, an organic layer 132, and a second inorganic layer 133 arranged sequentially. The color filter structure layer 15 is disposed between the first inorganic layer 131 and the organic layer 132.

In the first embodiment of the present application, the pixel definition layer 114 is used as the light shielding layer 10A, that is, the black matrix in the color filter structure layer 15 is replaced with the pixel definition layer 114, so a manufacturing process of the black matrix can be omitted to simplify a manufacturing process of the display panel and reduce production costs. In addition, since the black matrix would occupy a large area in the entire color filter structure layer 15, the above configuration can save some space of the panel, which is beneficial to achieve a thinner and lighter design of the display panel.

In addition, in the first embodiment of the present application, by integrating the color filter structure layer 15 with the encapsulation layer 13, the thickness of the display panel can be further reduced, thereby further improving the flexibility of the OLED display panel.

In the first embodiment of the present application, materials of the first planarization layer 112, the second planarization layer 110, and the dielectric insulating layer 108 are all black materials.

Specifically, the black material can be organic photoresist, an inorganic material, or other materials having a light-shielding effect, and the black material is not specifically limited by the present application.

Ambient light and light emitted by the light-emitting pixels 121 pass through the anode 1112 and other layers and enter the metal film layers of the array substrate 10, such as the first gate metal layer 105, the second gate metal layer 107, and the source/drain metal layer 109. By using black materials as the materials of the first planarization layer 112, the second planarization layer 110, and the dielectric insulating layer 108, the present application effectively prevents reflected light of the metal film layer from entering the light-emitting pixel 121 and affecting the light extraction efficiency of the light-emitting pixels 121. At the same time, the present application reduces a probability of color mixing between different light-emitting pixels 121, thereby making colors displayed on the display screen purer, and further improving the display effects of the display panel.

It should be noted that, in the first embodiment of the present application, the first planarization layer 112, the second planarization layer 110, and the dielectric insulating layer are all made of a black material, so light reflected off the metal film layers can be completely shielded. Alternatively, in some embodiments, only the first planarization layer 112 and the second planarization layer 110 are made of a black material, and a detailed description thereof is omitted herein for brevity.

Further, a plurality of first openings 112A are defined in the first planarization layer 112. The first opening 112A exposes the anode 1112. The light-emitting pixel 121 is disposed in the first opening 112A. A plurality of second openings 114A are defined in the pixel definition layer 114. The second openings 114A communicate with the first openings 112A in one-to-one correspondence. The light-emitting functional layer 12 also comprises a cathode layer 122. The cathode layer 122 is disposed on the pixel definition layer 114 and covers the second opening 114A.

In the first embodiment of the present application, the cathode layer 122 and the touch structure 14 are staggered from each other.

Specifically, the cathode layer 122 covers the second opening 114A and is located on a portion of the pixel definition layer 114 adjacent to the second opening 114A. The cathode layer 122 is staggered from the first electrode 1131, the second electrode 1132, and the bridge 1111. Such configuration effectively prevents touch signals generated in the touch structure 14 from being shielded by the cathode layer 122, thereby improving touch sensitivity.

Further, an etching process is used to pattern the film layer where the cathode layer 122 is located to form a patterned cathode layer 122. The specific etching process relates to conventional techniques, so a detailed description thereof is omitted for brevity.

In the OLED display panel 100 according to the first embodiment of the present application, the light shielding layer 10A is arranged on the touch structure 14, thereby effectively shielding the light incident on the touch structure 14 and avoiding light being reflected off the metal film layer in the touch structure 14, thus improving the display effects of the display panel.

Figure 2:
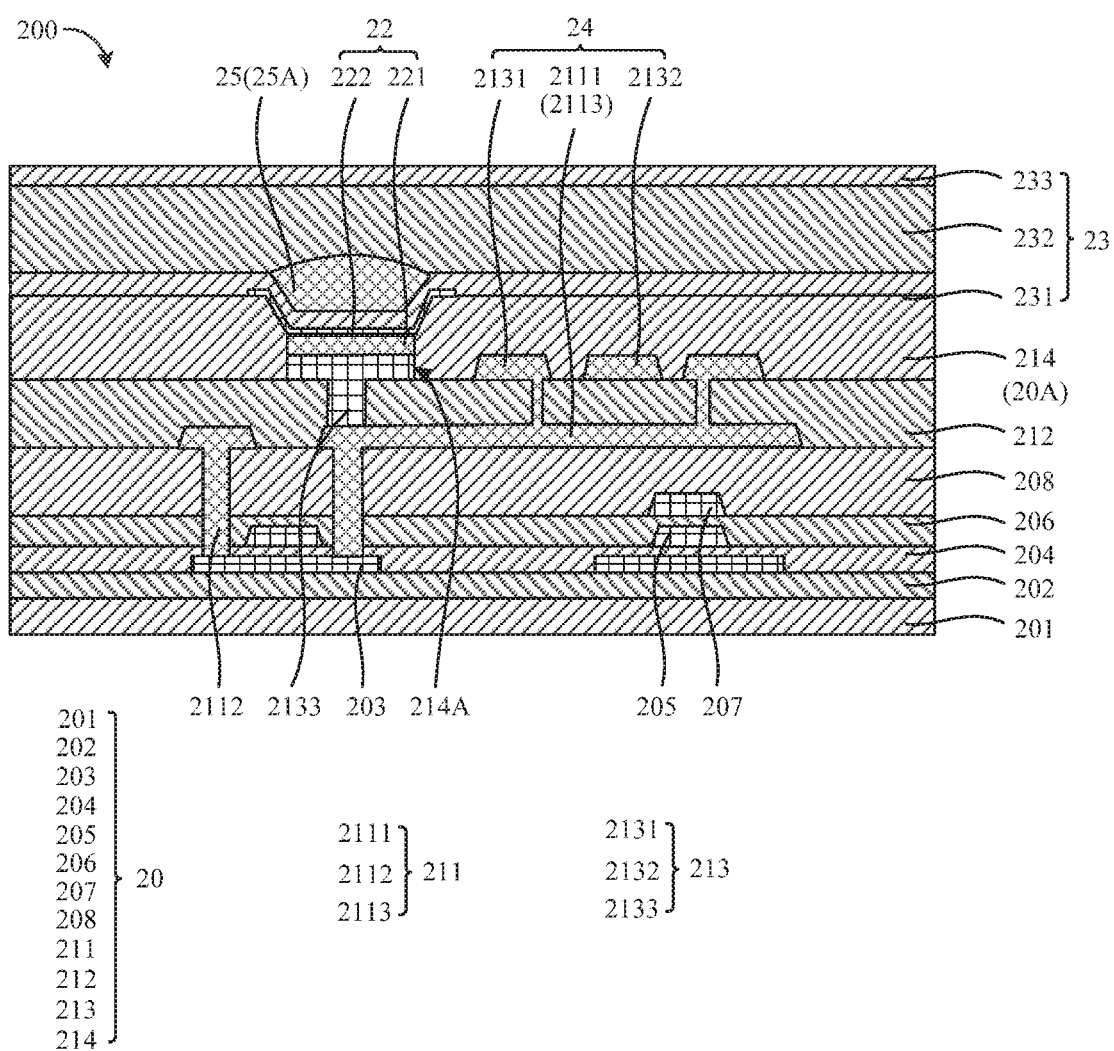
FIG. 2 is a schematic structural view illustrating the OLED display panel according to a second embodiment of the present application.

Please refer to FIG. 2, which is a schematic structural view of an OLED display panel 200 according to a second embodiment of the present application.

The OLED display panel 200 according to the second embodiment of the present application comprises an array substrate 20, a light-emitting functional layer 22, and an encapsulation layer 23 that are sequentially arranged. The array substrate 20 comprises a light shielding layer 20A. The OLED display panel 200 further comprises a touch structure 24 and a color filter structure layer 25. The touch structure 24 is integrated with the array substrate 20. The color filter structure layer 25 is integrated with the encapsulation layer 23. The light shielding layer 20A is disposed on the touch structure 24.

Therefore, by providing the light shielding layer 20A on the touch structure 24, the OLED display panel 200 of the second embodiment of the present application effectively shields the light incident on the touch structure 24, thus avoiding light being reflected off the metal film layer in the touch structure 24 and further improving the display effects of the display panel.

In addition, the second embodiment of the present application can also reduce a thickness of the display panel by integrating the touch structure 24 into the array substrate 20, thereby improving flexibility of the OLED display panel, which is conducive to the development of dynamically bendable OLED products.

In the second embodiment of the present application, the array substrate 20 comprises a substrate 201, a buffer layer 202, an active layer 203, a first insulating layer 204, a first gate metal layer 205, a second insulating layer 206, a second gate metal layer 207, a dielectric insulating layer 208, a first conductive layer 211, a first planarization layer 212, a second conductive layer 213, and a pixel definition layer 214.

Specifically, the first conductive layer 211 comprises a plurality of bridges 2111. The second conductive layer 213 comprises a plurality of first electrodes 2131 and a plurality of second electrodes 2132 arranged in the same layer. The adjacent first electrodes 2131 are electrically connected by the bridge 2111. The first electrodes 2131, the second electrodes 2132 and the bridges 2111 constitute the touch structure 24. The light shielding layer 20A is the pixel definition layer 214.

It should be noted that the light shielding layer 20A can also be disposed in other film layers of the array substrate 20, and a specific position of the light shielding layer 20A can be decided according to the position of the touch structure 24; the present application is not limited in this regard.

Selectively, the first electrode 2131 is a driving electrode, and the second electrode 2132 is a sensing electrode, or alternatively, the first electrode 2131 is a sensing electrode, and the second electrode 2132 is a driving electrode.

In the second embodiment of the present application, the first electrode 2131 is a driving electrode, and the second electrode 2132 is a sensing electrode. The first electrode 2131 and the second electrode 2132 are electrically insulated from each other.

It should be noted that the touch structure 24 in the second embodiment of the present application can be a mutual capacitance type or a self-capacitance type, and the present application is not limited in this regard.

It should be noted that the bridge 2111 is only used to connect the adjacent first electrodes 2131. The bridge 2111 can be disposed above or below the first electrode 2131. The second embodiment of the present application only takes for an example that the bridge 2111 is disposed below the first electrode 2131; however, the present application is not limited in this regard.

In the second embodiment of the present application, the first electrode 2131, the second electrode 2132, and the bridge 2111 are made of one or a combination of metals such as silver, gold, copper, or aluminum. In some embodiments, the first electrode 2131, the second electrode 2132, and the bridge 2111 can also be made of metal oxides such as indium tin oxide, indium zinc oxide, antimony tin oxide, or antimony zinc oxide, or other transparent conductive material; and a detailed description thereof is omitted herein for brevity.

In addition, the first electrode 2131, the second electrode 2132, and the bridge 2111 can be made of the same or different materials; the present application is not limited in this regard.

Selectively, a material of the light shielding layer 20A is black ink, organic photoresist, or other black materials with light shielding effects.

It can be understood that when the pixel definition layer 214 is used as the light shielding layer 20A, light incident on the touch structure 24 can be effectively shielded, thereby avoiding light being reflected off the first electrode 2131, the second electrode 2132, and the bridge 2111, which would be radiated to a display region of the panel to affect the display effects. Accordingly, the display quality of the display panel is improved.

In the second embodiment of the present application, the first conductive layer 211 further comprises a source 2112 and a drain 2113. The source 2112 and the drain 2113 are both arranged in the same layer as the bridge 2111. The second conductive layer 213 also comprises an anode 2133. The anode 2133 is disposed in the same layer as the first electrode 2131 and the second electrode 2132. The anode 2133 is electrically insulated from the first electrode 2131 and the second electrode 2132.

The above configuration can further reduce a thickness of the display panel, thereby further improving the flexibility of the OLED display panel. In addition, by using the first planarization layer 212 as an insulating layer between the electrode and the bridge in the touch structure 24, a mask process in the touch structure 24 is omitted, thereby reducing production costs.

Furthermore, the bridge 2111 and the drain 2113 are integrally formed. By using the drain 2113 as the bridge 2111, a mask process in the touch structure 24 is omitted, thereby further reducing production costs.

In addition, in some embodiments, the bridge 2111 and the drain 2113 can be electrically insulated from each other, and a detailed description thereof is not provided herein for brevity.

In the second embodiment of the present application, the light-emitting functional layer 22 comprises a plurality of light-emitting pixels 221. The color filter structure layer 25 comprises a plurality of color resists 25A. The color resists 25A are correspondingly arranged on the light-emitting pixels 221 in one-to-one correspondence.

In conventional OLED display panels, the color filter structure layer 25 is usually disposed above the encapsulation layer 23, and the color filter structure layer 25 comprises the color resists 25A and a black matrix between the color resists 25A. Since a refractive index of each film layer in the encapsulation layer 23 is different, there is usually a significant dispersion when the light emitted by the light-emitting pixel 221 passes through the encapsulation layer 23 having different refractive indexes, which directly affects the light extraction efficiency of the light-emitting pixels 221. In the second embodiment of the present application, by integrating the color filter structure layer 25 with the encapsulation layer 23, a distance between the color resist 25A and the light-emitting pixel 221 can be reduced, and a light path of the light-emitting pixel 221 can be reduced, thereby reducing a probability of dispersion and improving light extraction effects of the light-emitting pixels 221.

In addition, by reducing the distance between the light-emitting pixel 221 and the color filter structure layer 25, the present application reduces the probability that the light emitted from the light-emitting pixel 221 is absorbed by the black matrix in the color filter structure layer 15, thereby improving light utilization and improving light extraction efficiency of the light-emitting pixels 221.

Furthermore, under a premise that the light extraction efficiency of the light-emitting pixels 221, the present application can also reduce a size of an opening of the film layer where the color resists 25A are located, thereby meeting the design requirements for a high pixel density display panel, and further improving the display effects of the display panel.

Specifically, the encapsulation layer 23 comprises a first inorganic layer 231, an organic layer 232, and a second inorganic layer 233 arranged sequentially. The color filter structure layer 25 is disposed between the first inorganic layer 231 and the organic layer 232.

In the second embodiment of the present application, the pixel definition layer 214 is used as the light shielding layer 20A, that is, the black matrix in the color filter structure layer 25 is replaced with the pixel definition layer 214, so a manufacturing process of the black matrix can be omitted to simplify a manufacturing process of the display panel and reduce production costs. In addition, since the black matrix would occupy a large area in the entire color filter structure layer 25, the above configuration can save some space of the panel, which is beneficial to achieve a thinner and lighter design of the display panel.

In addition, in the first embodiment of the present application, by integrating the color filter structure layer 25 with the encapsulation layer 23, the thickness of the display panel can be further reduced, thereby further improving the flexibility of the OLED display panel.

In the second embodiment of the present application, materials of the first planarization layer 212 and the dielectric insulating layer 208 are all black materials.

Specifically, the black material can be organic photoresist, an inorganic material, or other materials having a light-shielding effect, and the black material is not specifically limited by the present application.

Ambient light and light emitted by the light-emitting pixels 221 pass through the anode 2133 and other film layers and enter the metal film layers of the array substrate 20, such as the first gate metal layer 205, the second gate metal layer 207, and the first conductive layer 2111. By using black materials as the materials of the first planarization layer 212 and the dielectric insulating layer 208, the present application effectively prevents reflected light of the metal film layer from entering the light-emitting pixel 221 and affecting the light extraction efficiency of the light-emitting pixels 221. At the same time, the present application reduces a probability of color mixing between different light-emitting pixels 221, thereby making colors displayed on the display screen purer, and further improving the display effects of the display panel.

It should be noted that, in the second embodiment of the present application, the first planarization layer 212 and the dielectric insulating layer 208 are made of a black material, so light reflected off the metal film layers can be shielded. Alternatively, in some embodiments, only the first planarization layer 212 is made of a black material, and a detailed description thereof is omitted herein for brevity.

Further, a plurality of first openings 214A are defined in the pixel definition layer 214. The first opening 214A exposes the anode 2133. The light-emitting pixel 221 is disposed on the anode 2133. The light-emitting functional layer 22 also comprises a cathode layer 122. The cathode layer 222 is disposed on the pixel definition layer 214 and covers the first opening 214A.

In the second embodiment of the present application, the cathode layer 222 and the touch structure 24 are staggered from each other.

Specifically, the cathode layer 222 covers the first opening 214A and is located on a portion of the pixel definition layer 214 adjacent to the first opening 214A. The cathode layer 222 is staggered from the first electrode 2131, the second electrode 2132, and the bridge 2111. Such configuration effectively prevents touch signals generated in the touch structure 24 from being shielded by the cathode layer 222, thereby improving touch sensitivity.

Furthermore, an etching process is used to pattern the film layer where the cathode layer 222 is located to form a patterned cathode layer 222. The specific etching process relates to conventional techniques, so a detailed description thereof is omitted for brevity.

In the OLED display panel 200 of the second embodiment of the present application, the light shielding layer 20A is arranged on the touch structure 24, thereby effectively shielding the light incident on the touch structure 24, avoiding light being reflected off the metal film layer in the touch structure 24, and improving the display effects of the display panel. In addition, by placing the bridge 2111 in the same layer as the source 2112 and the drain 2113, and arranging the first electrode 2131 and the second electrode 2132 in the same layer as the anode 2133, the present application can reduce the thickness of the display panel and improve the flexibility of the OLED display panel.

Compared with conventional OLED display panels, the OLED display panel of the present application is provided with the light shielding layer on the touch structure, thereby effectively shielding the light incident on the touch structure and avoiding light being reflected off the metal film layer in the touch structure, thus improving display effects of the display panel.

The embodiments of the present application are described in detail above, and specific examples have been used to explain the working principles and embodiments of the present application. Those of ordinary skill in the art, based on the concepts of the present application, can modify the embodiments and their applications. In summary, the content of this specification should not be construed as limiting the present application.

What is claimed is:

1. An organic light-emitting diode (OLED) display panel, comprising:
    an array substrate, the array substrate comprising a light shielding layer and a first conductive layer, wherein in the array substrate, a first planarization layer, a second conductive layer, and a pixel definition layer are sequentially disposed on the first conductive layer, and the light shielding layer is the pixel definition layer, wherein the first conductive layer comprises an anode, a source, a drain, and a plurality of bridges, wherein the anode, the source, and the drain are all arranged in a same layer as the bridges, and the anode is electrically insulated from the bridges, wherein the second conductive layer comprises a plurality of first electrodes and a plurality of second electrodes arranged in a same layer, the adjacent first electrodes are electrically connected by the bridge, and the first electrodes, the second electrodes, and the bridges constitute the touch structure; and
    a touch structure integrated with the array substrate;
    wherein the light shielding layer is disposed on the touch structure.

2. The OLED display panel according to claim 1, wherein the OLED display panel further comprises:
    a light-emitting functional layer disposed on the array substrate, the light-emitting functional layer comprising a plurality of light-emitting pixels;
    an encapsulation layer disposed on the light-emitting functional layer; and
    a color filter structure layer integrated with the encapsulation layer, wherein the color filter structure layer comprises a plurality of color resists, and the color resists are disposed on the light-emitting pixels in one-to-one correspondence.

3. The OLED display panel according to claim 2, wherein the encapsulation layer comprises a first inorganic layer, an organic layer, and a second inorganic layer disposed in sequence, and the color filter structure layer is disposed between the first inorganic layer and the organic layer.

4. The OLED display panel according to claim 2, wherein the array substrate further comprises a substrate, a buffer layer, an active layer, a first insulating layer, a first gate metal layer, a second insulating layer, a second gate metal layer, a dielectric insulating layer, a source/drain metal layer, and a second planarization layer arranged in sequence, and the first planarization layer, the second planarization layer, and the dielectric insulating layer are all made of a black material.

5. The OLED display panel according to claim 4, wherein a plurality of first openings are defined in the first planarization layer, the first openings expose the anode, and the light-emitting pixels are disposed in the first openings; a plurality of second openings are defined in the pixel definition layer, and the second openings are arranged corresponding to and in communication with the first openings, respectively; and the light-emitting functional layer further comprises a cathode layer disposed on the pixel definition layer and covers the second opening.

6. The OLED display panel according to claim 2, wherein the second conductive layer further comprises an anode disposed in a same layer as the first electrodes and the second electrodes, and the anode is electrically insulated from the first electrodes and the second electrodes.

7. The OLED display panel according to claim 6, wherein the bridges and the drain are integrally formed.

8. An organic light-emitting diode (OLED) display panel, comprising:

an array substrate comprising a light shielding layer, wherein in the array substrate, a first conductive layer, a first planarization layer, a second conductive layer, and a pixel definition layer are arranged in sequence, and the light shielding layer is the pixel definition layer, wherein the first conductive layer comprises a plurality of bridges, the second conductive layer comprises a plurality of first electrodes and a plurality of second electrodes arranged in a same layer, the adjacent first electrodes are electrically connected by the bridge, and the first electrodes, the second electrodes, and the bridges constitute the touch structure; and a touch structure integrated with the array substrate;

wherein the light shielding layer is disposed on the touch structure.

9. The OLED display panel according to claim 8, wherein the OLED display panel further comprises:

a light-emitting functional layer disposed on the array substrate, the light-emitting functional layer comprising a plurality of light-emitting pixels;

an encapsulation layer disposed on the light-emitting functional layer; and a color filter structure layer integrated with the encapsulation layer, the color filter structure layer comprising a plurality of color resists, the color resists disposed on the light-emitting pixels in one-to-one correspondence.

10. The OLED display panel according to claim 9, wherein the encapsulation layer comprises a first inorganic layer, an organic layer, and a second inorganic layer disposed in sequence, and the color filter structure layer is disposed between the first inorganic layer and the organic layer.

11. The OLED display panel according to claim 9, wherein the first conductive layer further comprises an anode disposed in a same layer as the bridges and electrically insulated from the bridges.

12. The OLED display panel according to claim 11, wherein the array substrate further comprises a substrate, a buffer layer, an active layer, a first insulating layer, a first gate metal layer, a second insulating layer, a second gate metal layer, a dielectric insulating layer, a source/drain metal layer, and a second planarization layer arranged in sequence, and the first planarization layer, the second planarization layer, and the dielectric insulating layer are all made of a black material.

13. The OLED display panel according to claim 12, wherein a plurality of first openings are defined in the first planarization layer, the first openings expose the anode, and the light-emitting pixels are disposed in the first openings; a plurality of second openings are defined in the pixel definition layer, and the second openings are arranged corresponding to and in communication with the first openings, respectively;

the light-emitting functional layer further comprises a cathode layer disposed on the pixel definition layer and covers the second openings.

14. The OLED display panel according to claim 13, wherein the cathode layer and the touch structure are staggered from each other.

15. The OLED display panel according to claim 9, wherein the first conductive layer further comprises a source and a drain, and the source and the drain are both disposed in a same layer as the bridges; and the second conductive layer further comprises an anode disposed in a same layer as the first electrodes and the second electrodes, the anode electrically insulated from the first electrodes and the second electrodes.

16. The OLED display panel according to claim 15, wherein the bridges and the drain are integrally formed.

17. The OLED display panel according to claim 15, wherein the array substrate further comprises a base substrate, a buffer layer, an active layer, a first insulating layer, a first gate metal layer, a second insulating layer, a second gate metal layer, and a dielectric insulating layer disposed in sequence, and the first planarization layer and the dielectric insulating layer are both made of a black material.

18. The OLED display panel according to claim 17, wherein a plurality of first openings are defined in the pixel definition layer, the first openings expose the anode, and the light-emitting pixels are disposed on the anode; and the light-emitting functional layer further comprises a cathode layer disposed on the pixel definition layer and covers the first openings.

* * * * *